United States Patent [19]
Yen

[11] Patent Number: 5,597,410
[45] Date of Patent: Jan. 28, 1997

[54] METHOD TO MAKE A SOI WAFER FOR IC MANUFACTURING

[76] Inventor: Yung C. Yen, 5770 Harder St., San Jose, Calif. 95129

[21] Appl. No.: 306,471

[22] Filed: Sep. 15, 1994

[51] Int. Cl.⁶ .................................................. C30B 25/02
[52] U.S. Cl. ........................... 117/84; 156/153; 437/228
[58] Field of Search ............................ 117/84; 156/153; 437/21, 228

[56] References Cited

U.S. PATENT DOCUMENTS 5,152,857  10/1992  Ito et al. .................................. 156/153
5,401,670   3/1995  Yen ......................................... 437/21

*Primary Examiner*—R. Bruce Breneman
*Assistant Examiner*—FeLisa Garrett

[57] ABSTRACT

A method to eliminate the sharp edge problem in the bonded wafer technique of the SOI technology is achieved by employing a different dimension of the front surface between the bonding wafer and the holding substrate. A thin film layer with a predetermined thickness is formed to planarize the edge of the finished semiconductor film when the fabrication of the SOI wafer is completed.

12 Claims, 8 Drawing Sheets

METHOD TO MAKE A SOI WAFER FOR IC MANUFACTURING

FIELD OF INVENTION

This invention relates to the field of SOI technology, in particular in making a single crystal silicon film on insulator with the bonded wafer technique.

BACKGROUND OF INVENTION

It was well-known that the edge of the silicon wafer was necessary to be bevelled for IC (integrated circuits) manufacturing. In the conventional bonded wafer technique of the SOI (single-crystal Semiconductor-film On Insulator) technology, when two of this kind of silicon wafers were bonded together as shown in FIG. 1, followed by the lapping and polishing operation to obtain a silicon film on insulator, it resulted in a sharp edge in the SOI structure as shown in FIG. 2.

As shown in FIG. 1, one wafer is called holding wafer 100 and the other is called bonding wafer 110. The holding wafer 100 has a silicon dioxide (oxide) layer which is called holding oxide layer 101, flat mirror-like polished front surface called holding front surface 130, bevelled holding front surface 120, holding back surface 129, and bevelled holding back surface 119. Similarly, bonding wafer 110 has a silicon dioxide (oxide) layer called bonding oxide layer 111, flat mirror-like polished surface called bonding front surface 131, bevelled bonding front surface 121, bonding back surface 132, and bevelled bonding back surface 122. By facing both bonding and holding front surfaces, 131 and 130 respectively, bonding wafer 110 and holding wafer 100 were bonded together in the current technique. Between bonding front surface 131 and holding front surface 130 was the interposed oxide layer which consists of holding oxide layer 101 and bonding oxide layer 111. The operation of lapping and polishing bonding back surface 132 was followed to result in silicon film 112 on insulator (interposed oxide layer) as shown in FIG. 2. It clearly showed the sharp edge of the silicon film 112 in this SOI wafer. This sharp edge will cause a serious problem in IC manufacturing. A technique to solve this problem has been reported in U.S. Pat. No. 5,152,857 by Ito et al.. It employed a carefully calculated bevelled front surface and a special polishing process to achieve the desired bevelled front surface of the silicon film on insulator. Obviously, this technique required an accurate edge bevelling operation and a precision alignment operation in the bonding process. Another technique has also been reported in U.S. patent application No. 08/120, 797 by Y. C. Yen. This technique employed an additional bonding-assistant tool to obtain the silicon film having the original bevelled edge. Both methods are not simple in the actual implementation in SOI wafer manufacturing and suffer a drawback which is that the peripheral edge of the interposed oxide layer is exposed without any protection during wafer processing. It will cause some difficulty in IC manufacturing. This invention will teach a simple manufacturable technique to solve the edge problem.

SUMMARY OF INVENTION

It is the object of this invention to provide a technique to produce a single crystal semiconductor film on insulator in such a manner that the sharp edge of the semiconductor film in SOI wafer fabricated with the bonded wafer technique is eliminated by employing a thin film formation in the fabrication process such that it will planarize the edge after the completion of this SOI wafer fabrication.

BRIEF DESCRIPTION OF DRAWINGS

All drawings are not in the actual dimensions or shapes and not proportional to scale. The only purpose of drawings is to explain the operational principle of this invention.

DETAILED DESCRIPTION OF INVENTION

The fundamental principle of this invention is in the utilization of the different dimension of the front surface between the bonding wafer and the holding wafer in such a manner that the front surface dimension of the bonding wafer is smaller than that of the holding wafer by the amount not less than the sum of the thickness of the desired silicon film of the SOI wafer, the lost thickness of the bonding oxide layer due to process steps, the lost thickness of the holding oxide layer due to process steps, and the amount of the alignment tolerance of the bonding operation.

Figure 1:
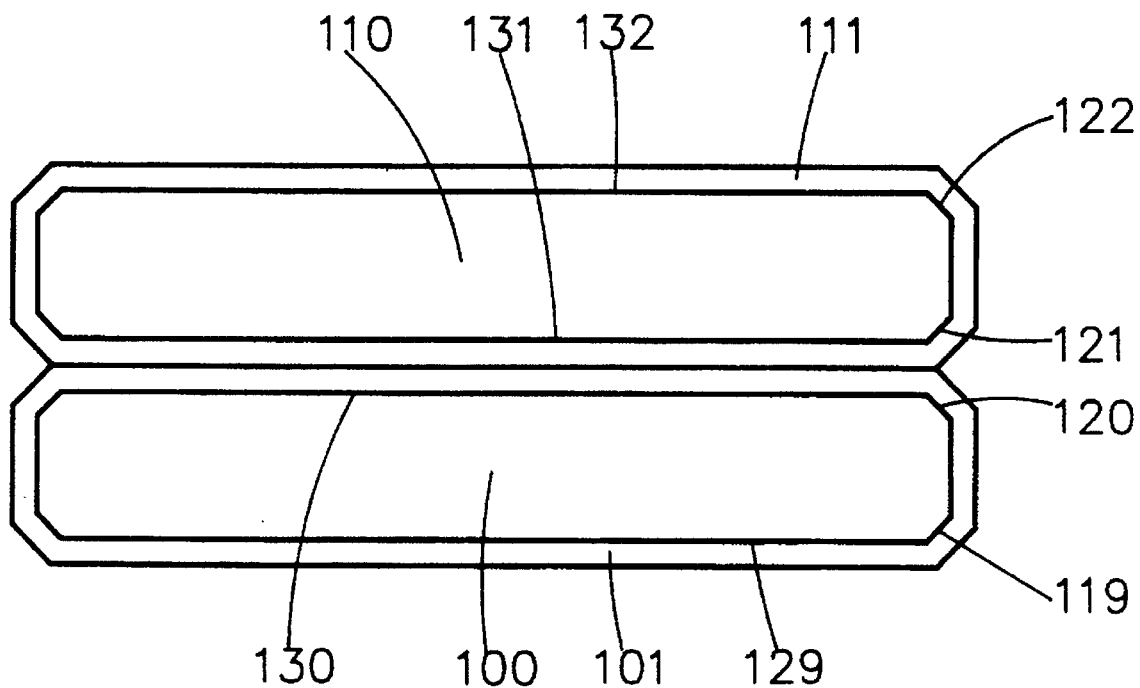
FIG. 1 and FIG. 2 are the cross-sectional views of the prior art.
Figure 2:
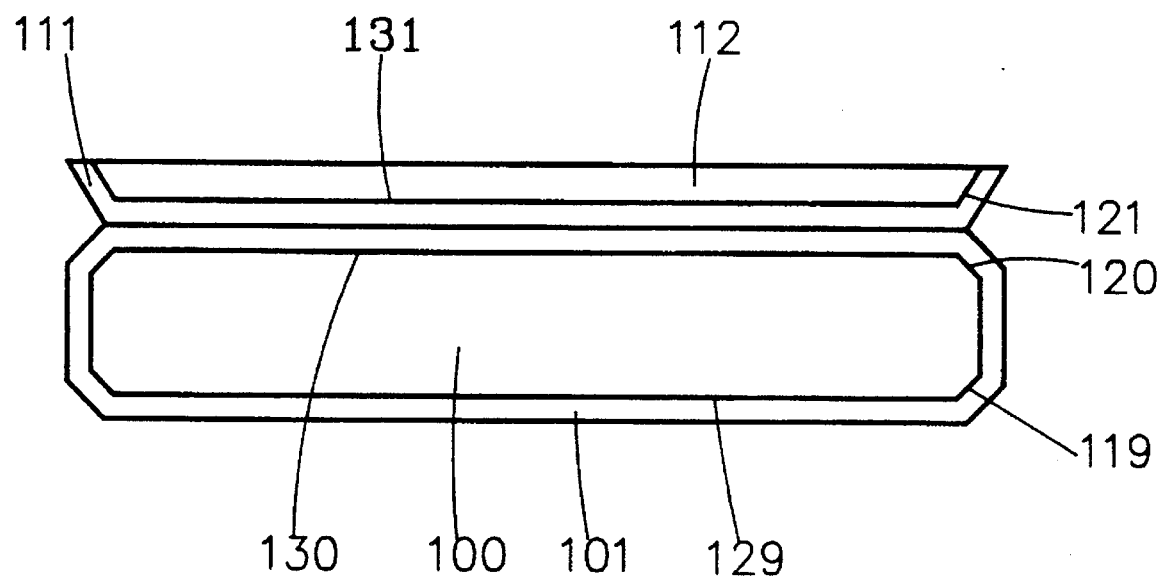
Figure 3:
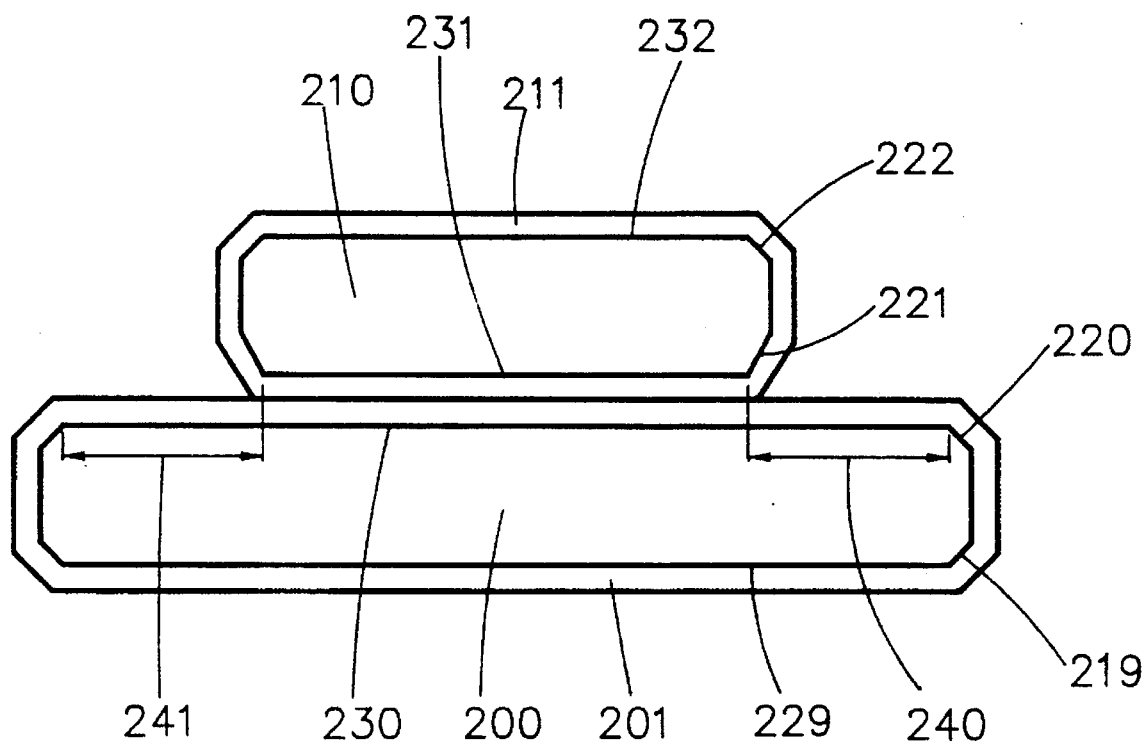
FIG. 3 shows the preferred structure of this invention in a cross sectional view.

The preferred bonded wafer structure is shown in FIG. 3 in a cross sectional view. The holding wafer 200 with the holding oxide layer 201 has larger dimension than the bonding wafer 210 with the bonding oxide layer 211. The difference between the edge of the bonding front surface 231 and of the holding front surface 230 is designated as distance-A 240 at one end and as distance-B 241 at the other end. Distance-A 240 and distance-B 241 may or may not have the same amount, depending on the alignment operation in the bonding process to bond the bonding wafer 210 onto the holding wafer 200. The bonding back surface 232 and the holding back surface 229 are not necessarily like the bonding front surface 231 and the holding front surface 230 respectively to be mirror-like polishing finish, but are flat like both front surfaces. Bevelled bonding front surface 221, bevelled bonding back surface 222, bevelled holding front surface 220, and bevelled back surface 219 may or may not be the same.

Figure 4:
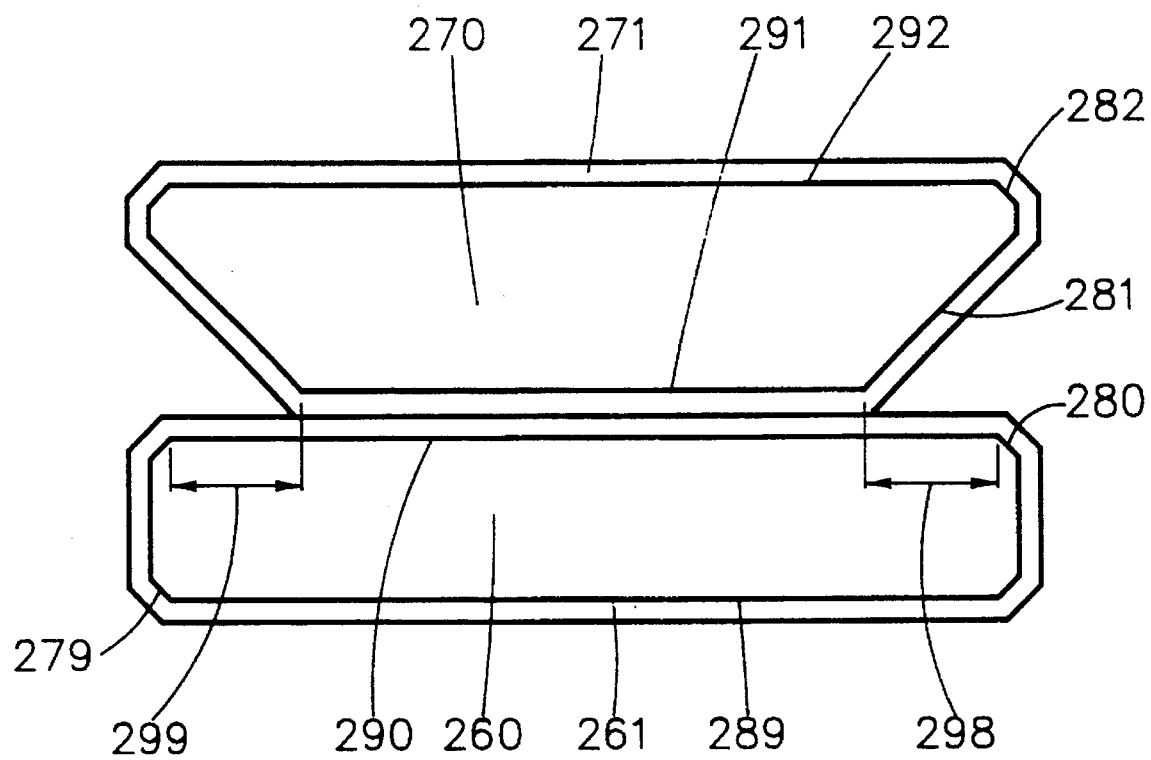
FIG. 4 shows the alternative structure of this invention in a cross sectional view.

The alternative structure is shown in FIG. 4. In this case, bonding wafer 270 has the same dimension as holding wafer 260. Although not shown, it equally works well for the case that bonding wafer 270 has a larger dimension than the holding wafer 260 for the alternative structure. But the bonding front surface 291 is smaller than the holding front surface 290. Obviously, it is preferred that the bevelled bonding front surface 281 is different from the bevelled holding front surface 280, the bevelled bonding back surface 282, and the bevelled holding back surface 279. The difference between the edge of the bonding front surface 291 and of the holding front surface 290 is designated as distance-C 298 at one end and as distance-D 299 at the other end. Likewise, distance-C 298 and distance-D 299 may or may not have the same amount, depending on the alignment operation in the bonding process. All edges in FIG. 3 and 4 are bevelled with the conventional method. As shown in FIG. 3, the interposed oxide layer consists of the portion of the holding oxide layer 201 and the bonding oxide layer 211 between the holding front surface 230 and the bonding front surface 231. Similarly, in the alternative structure shown in FIG. 4, the interposed oxide layer consists of the portion of the holding oxide layer 261 and the bonding oxide layer 271 between the holding front surface 290 and the bonding front surface 291. Typically, the interposed oxide layer has a thickness of 0.5–1.0 um (micro-meter). For the better result, it is preferred that the bonding oxide layer 211 of FIG. 3 or 271 of FIG. 4 is much thinner than the holding oxide layer 201 of FIG. 3 or 261 of FIG. 4 respectively, and can even be a native oxide layer which is grown at the completion of the wafer cleaning step with the thickness less than 30 Angstroms typically.

Figure 5:
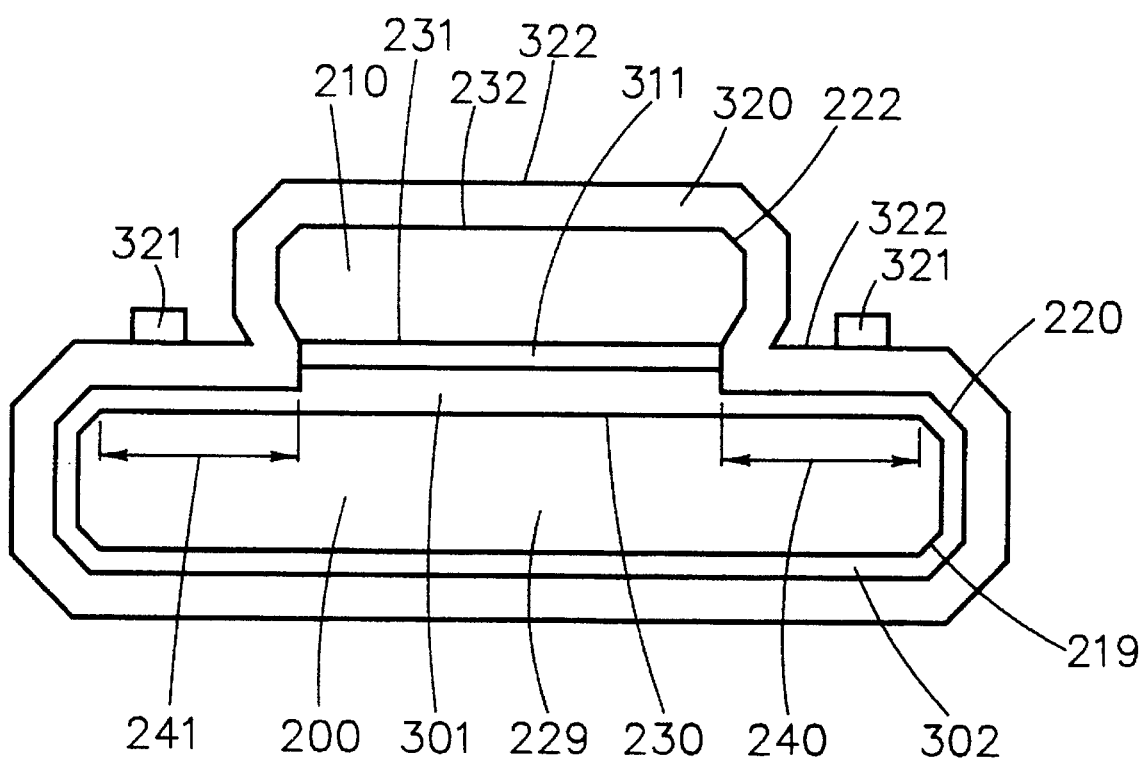
FIG. 5 and FIG. 6 show an example of the thin film formation on the preferred structure and on the alternative structure respectively.
Figure 6:
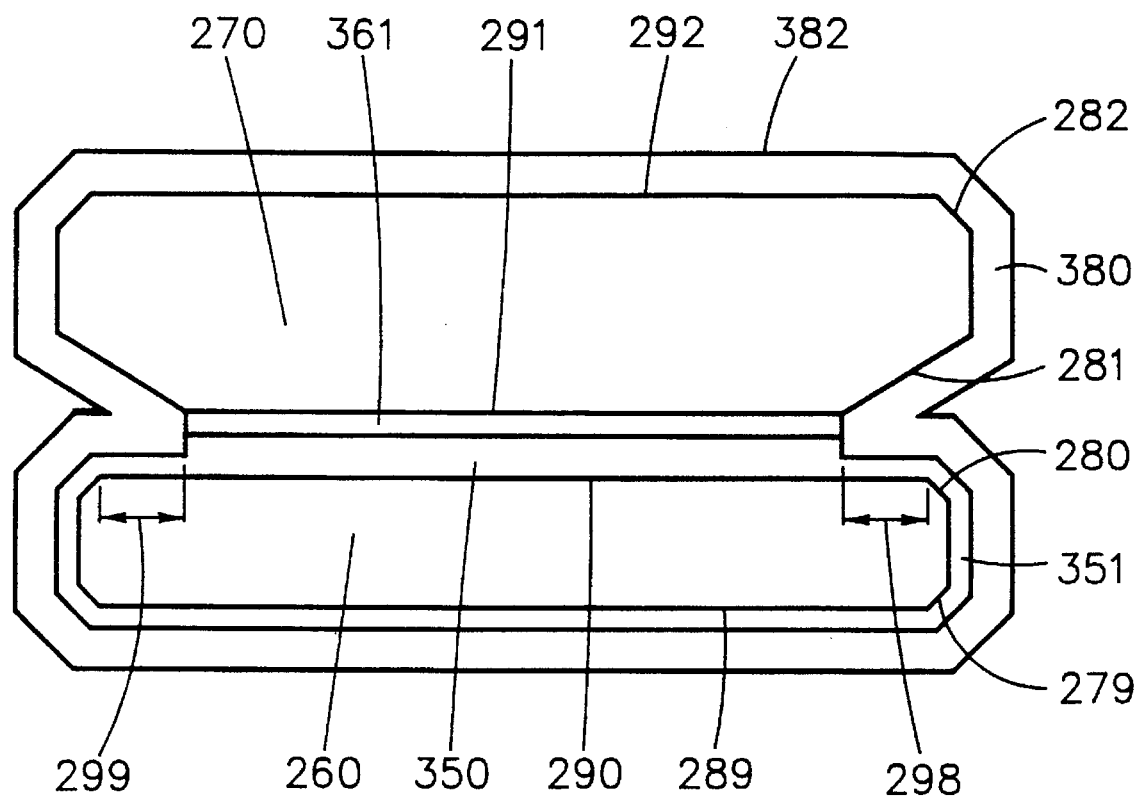

Now, the conventional wet chemical etch technique is employed to etch off the bonding oxide layer 211 of FIG. 3 or 271 of FIG. 4. Since the bonding oxide layer 211 of FIG. 3 is much thinner than the holding oxide layer 201 as mentioned above, the holding oxide layer 201 is not completely etched off, but only thinned down by the etch process. Therefore, after the completion of the etch process, the interposed oxide layer remains unchanged. The bonding wafer 210 has the left bonding oxide layer 311 which is a part of the interposed oxide layer as shown in FIG. 5. The holding wafer 200 has the unchanged thickness holding oxide layer 301 and the reduced thickness holding oxide layer 302 as shown in FIG. 5. Similarly, as shown in FIG. 6 after the completion of the etch process, the holding wafer 260 has the unchanged thickness holding oxide layer 350 and the reduced thickness holding oxide layer 351. The bonding wafer 270 has the left bonding oxide layer 361 which is a part of the interposed oxide layer. After the completion of the wafer etch process step, a thin film layer which is a poly crystal silicon layer 320 in this example is deposited with the conventional chemical vapor deposition (CVD) method as shown in FIG. 5. The thickness of the poly crystal silicon layer 320 is not thinner than the sum of the thickness of the desired silicon film which is to be made such as the silicon film 400 shown in FIG. 7, the lost thickness of the bonding oxide layer 211 which is equal to the thickness of the bonding oxide layer 211 in this example and the lost thickness of the holding oxide layer 201 due to the etch process mentioned above. Similarly, a poly crystal silicon layer 380 is deposited on the alternative structure after the etch of the bonding oxide layer 271 as shown in FIG. 6.

Figure 7:
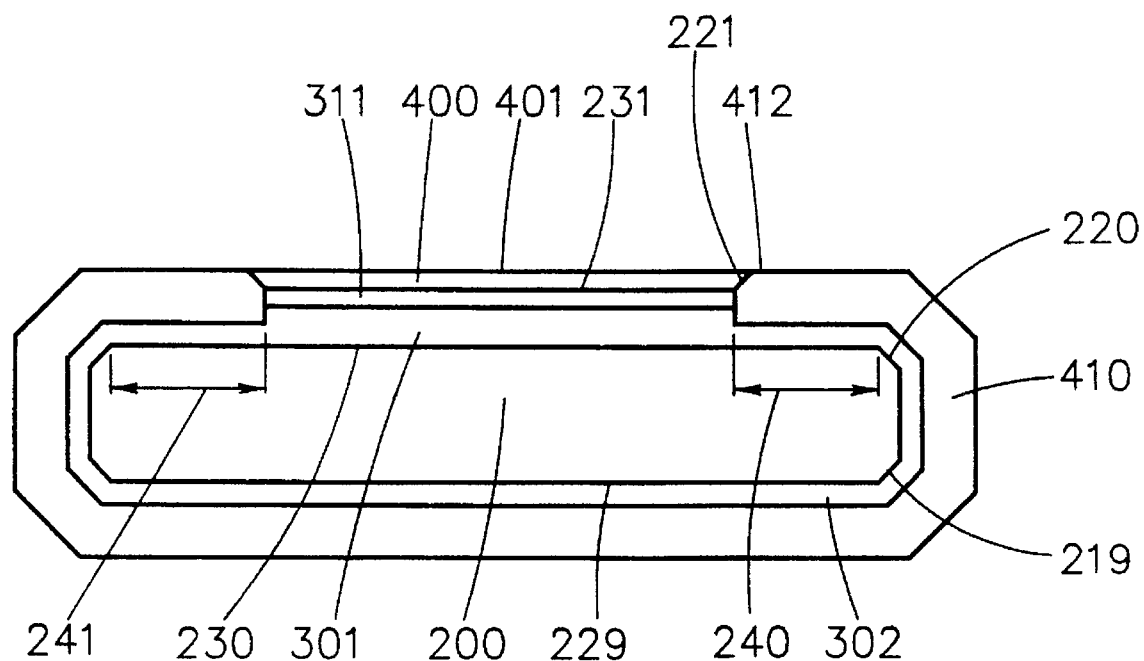
FIG. 7 and FIG. 8 show the final structure of the SOI wafer after the completion of the fabrication for the preferred structure and the alternative structure respectively.
Figure 8:
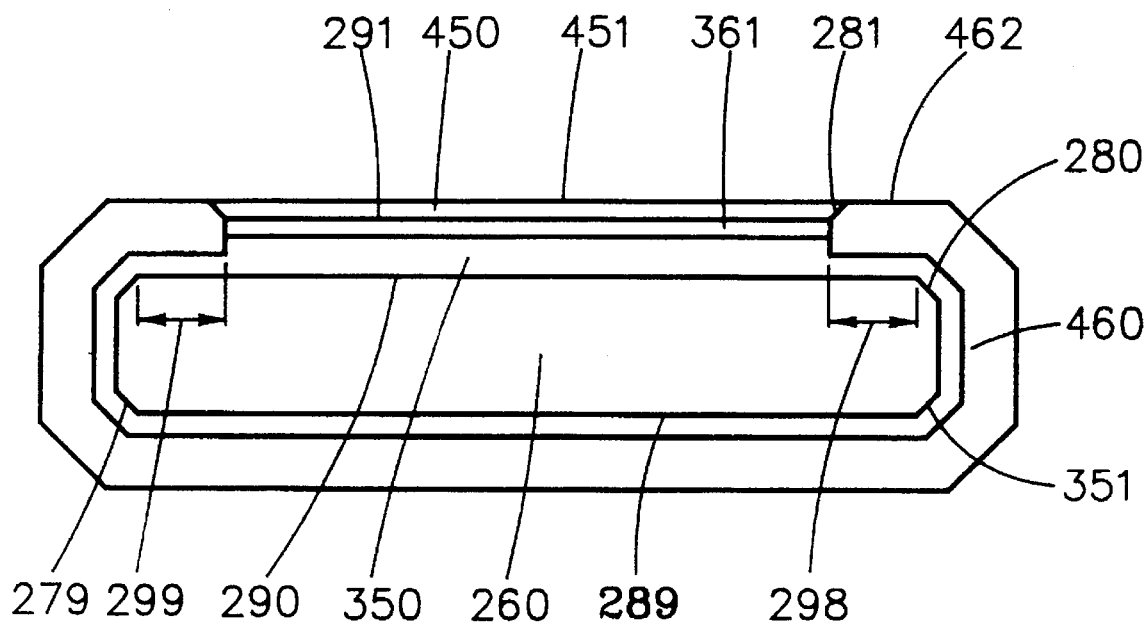

Alternatively, the above mentioned deposition of the poly crystal silicon layer 320 of FIG. 5 or 380 of FIG. 6 can be carried out after the bonding wafer 210 of FIG. 3 or 270 of FIG. 4 is lapped and polished to any convenient thickness which is not thinner than thickness of the desired silicon film which is to be obtained such as the silicon film 400 of FIG. 7 or 450 or FIG. 8 respectively. Or when the bonding wafer 210 of FIG. 3 or 270 or FIG. 4 is thick enough to allow the slicing operation, then the deposition of the poly crystal silicon layer 320 of FIG. 5 or 380 of FIG. 6 is carried out after the slicing operation to make the bonding wafer 210 of FIG. 3 or 270 of FIG. 4 a thin wafer, followed by the lapping and polishing operation.

After the formation of the poly crystal silicon layer 320 as shown in FIG. 5, a pattern 321 is formed on the poly surface 322 of the poly crystal silicon layer 320. The material of the pattern 321 is different from silicon. In this example, it can be silicon dioxide or silicon nitride. The pattern 321 is formed on the flat portion of the poly surface 322 in the area of distance-A 240 and distance-B 241. This pattern 321 can be used as a monitor to thin down the bonding wafer 210 with the mechanical lapping and polishing method, or as a polishing stop layer when a selective polishing process is employed. On the other hand, in the alternative structure as shown in FIG. 6, it is not so convenient to make such a pattern 321 of FIG. 5, because the flat portion of the poly surface 382 in the area of distance-C 298 and distance-D 299 on the holding wafer 260 is blocked by the bonding wafer 270 or is much smaller when the bonding wafer 270 is first reduced to the convenient thickness as mentioned above before the deposition of the poly crystal silicon layer 380. The formation of the pattern 321 of FIG. 5 is not a necessary step to carry out this invention. It is only the advantage of the preferred structure over the alternative structure.

Now, the poly crystal silicon layer 320 and the bonding wafer 210 of FIG. 5 are thinned down with the conventional mechanical lapping and polishing method to obtain the desired silicon film 400 as shown in FIG. 7. The SOI wafer so obtained consists of the single crystal silicon film 400 on insulator which is the interposed oxide layer on substrate which is the holding wafer 200 and the remaining poly crystal silicon layer 410 on the reduced thickness holding oxide layer 302 on substrate which is the holding wafer 200. The top surface consists of the single crystal surface 401 of the single crystal silicon film 400 and the poly surface 412 of the remaining poly crystal silicon layer 410. The single crystal surface 401 and the poly surface 412 are flat and smoothly continuous. The sharp edge of the bevelled surface 221 is planarized by the remaining poly crystal silicon layer 410. Also, the peripheral edge of the interposed oxide layer is covered and protected by the remaining poly crystal silicon layer 410.

Similarly, the poly crystal layer 380 and the bonding wafer 270 of FIG. 6 are thinned down as mentioned above to obtain silicon film 450 as shown in FIG. 8. Likewise, the silicon surface 451 and the poly surface 462 of the remaining poly crystal silicon layer 460 are flat and smoothly continuous. The difference between FIG. 7 and FIG. 8 is that the distance-C 298 or the distance-D 299 is smaller than the distance-A 240 or the distance-B 241. Otherwise, both SOI wafers are identical.

In the above example, a poly crystal silicon layer 320 of FIG. 5 or 380 of FIG. 6 is used as an example for the thin film formation. There are several other materials which can be used. For example, silicon dioxide layer can be deposited with the conventional CVD method to the thickness which is determined with the method mentioned in the deposition of the poly crystal silicon layer 320 of FIG. 5, or 380 of FIG. 6. Then both silicon dioxide layer and the bonding wafer 210 of FIG. 5 or 270 of FIG. 6 are thinned down to obtain SOI wafer like the structure shown in FIG. 7 or FIG. 8 respectively. The other example is the use of the silicon nitride layer which can also be deposited with the conventional CVD method to the thickness determined by the same method mentioned above. Same thinning down process is followed to obtain SOI wafer. Another example is the epitaxial growth of the single crystal silicon layer. In this case, the bonding oxide layer 211 and the holding oxide layer 201 of FIG. 3 or the bonding oxide layer 271 and the holding oxide layer 261 of FIG. 4 are etched off with the conventional wet chemical etch method such that only interposed oxide layer remains. Then the conventional CVD epitaxy technique is employed to grow a single crystal silicon layer to the thickness determined by the same method mentioned above.

Although the above mentioned thinning-down process employs the conventional mechanical method, other techniques like chemical etch technique or the combination of both mechanical and chemical etch techniques can also be employed.

What is claimed is:

1. A method of making a single crystal semiconductor film comprising:
   a) providing a single crystal semiconductor wafer with bevelled edges which is encapsulated by a first oxide layer, wherein said first oxide layer forms at least a bonding front surface and a bonding back surface opposite said bonding front surface;
   b) providing a substrate with bevelled edges which is encapsulated by a second oxide layer, wherein said first oxide layer forms at least a holding front surface and a holding back surface opposite said holding front surface;
   c) bonding said bonding front surface of the wafer from step a) to said holding front surface of the substrate from step (b), wherein said holding front surface is longer than said bonding front surface;
   d) etching said bonding back surface and a portion of said single crystal semiconductor wafer so as to reduce the thickness thereof;
   e) forming a layer on all exposed surfaces of the assembly resulting from step d);
   f) removing that portion of the layer formed in step e) which covers the bonding back surface, as well as a portion of the single crystal semiconductor wafer such that said wafer becomes an exposed single crystal film which is planar with the portion of the polysilicon layer which remain above the holding front surface of the substrate.

2. The process of claim 1 wherein in step a) the bonding back surface is larger than the bonding front surface.

3. The process of claims 1 or 2 wherein polycrystalline silicon layer is formed by chemical vapor deposition.

4. The process of claims 1 or 2 wherein the material removal in step f) is performed by chemical etching.

5. The process of claims 1 or 2 wherein the material removal in step f) is performed by lapping.

6. The process of claim 5 wherein prior to step f) a polishing stop layer is formed and patterned on the holding front surface.

7. The process of claim 6 wherein the polishing stop layer comprises silicon nitride.

8. The process of claim 6 wherein the polishing stop layer comprises silicon dioxide.

9. The process of claims 1 or 2 wherein the first oxide layer in step a) is thinner than the second oxide layer in step b).

10. The process of claim 9 wherein said first oxide layer is a native oxide layer.

11. The process of claims 1 or 2 in which the layer of step e) is selected from the group consisting of polycrystalline silicon and silicon dioxide.

12. The process of claims 1 or 2 wherein the thickness of the layer formed in step e) is greater than the sum of the thicknesses of the first oxide layer of step a), the second oxide layer of step b), and the single crystal film of step f).

* * * * *